United States Patent
Lee et al.

(10) Patent No.: US 10,049,755 B2
(45) Date of Patent: Aug. 14, 2018

(54) STORAGE DEVICE INCLUDING NONVOLATILE MEMORY DEVICE AND CONTROLLER WITH VARIED READ WEIGHTS

(71) Applicants: Heewon Lee, Suwon-si (KR); Sari Go, Hwaseong-si (KR); Seungkyung Ro, Anyang-si (KR); Seongnam Kwon, Bucheon-si (KR)

(72) Inventors: Heewon Lee, Suwon-si (KR); Sari Go, Hwaseong-si (KR); Seungkyung Ro, Anyang-si (KR); Seongnam Kwon, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/423,629

(22) Filed: Feb. 3, 2017

(65) Prior Publication Data
US 2018/0004415 A1 Jan. 4, 2018

(30) Foreign Application Priority Data
Jun. 30, 2016 (KR) .................. 10-2016-0082774

(51) Int. Cl.
G11C 16/34 (2006.01)
G06F 3/06 (2006.01)
G11C 16/04 (2006.01)

(52) U.S. Cl.
CPC ........ G11C 16/3418 (2013.01); G06F 3/0679 (2013.01); G11C 16/0483 (2013.01); G11C 16/3422 (2013.01); G11C 16/3427 (2013.01)

(58) Field of Classification Search
CPC ............ G11C 16/3418; G11C 16/3422; G11C 16/3427
See application file for complete search history.

(56) References Cited

U.S. PATENT DOCUMENTS

| | | |
|---|---|---|
| 7,401,196 B2 | 7/2008 | Mori et al. |
| 7,663,933 B2 | 2/2010 | Tsukazaki et al. |
| 7,679,133 B2 | 3/2010 | Son et al. |
| 7,751,238 B2 | 7/2010 | Seol |

(Continued)

FOREIGN PATENT DOCUMENTS

| | | |
|---|---|---|
| JP | 2009037317 A | 2/2009 |
| JP | 2010015191 A | 1/2010 |
| JP | 2012146129 A | 8/2012 |

*Primary Examiner* — Vanthu Nguyen
(74) *Attorney, Agent, or Firm* — Volentine, Whitt & Francos, PLLC

(57) ABSTRACT

A storage device includes a nonvolatile memory device and a controller. The nonvolatile memory device includes multiple memory blocks, each of which includes memory cells. The controller reads data from selected memory cells of a memory block selected from the memory blocks during a read operation. The selected memory cells correspond to both a word line and a string selection line selected as a read target. The controller increases a read count by a read weight corresponding to the selected word line and string selection line of the selected memory block, and performs a refresh operation on the selected memory cells if the read count reaches a threshold value. In the selected memory block, two or more read weights are assigned according to locations of the string selection lines and the word lines.

18 Claims, 11 Drawing Sheets

(56) References Cited

U.S. PATENT DOCUMENTS

| | | | |
|---|---|---|---|
| 7,778,078 B2 | 8/2010 | Nagadomi et al. | |
| 8,189,379 B2 | 5/2012 | Camp et al. | |
| 8,510,528 B2 | 8/2013 | Rubio et al. | |
| 8,553,466 B2 | 10/2013 | Han et al. | |
| 8,559,224 B2* | 10/2013 | Han | G11C 16/10 |
| | | | 365/185.11 |
| 8,559,235 B2 | 10/2013 | Yoon et al. | |
| 8,654,587 B2 | 2/2014 | Yoon et al. | |
| 8,930,778 B2 | 1/2015 | Cohen | |
| 8,943,263 B2 | 1/2015 | Frost et al. | |
| 9,025,375 B2 | 5/2015 | Chang et al. | |
| 9,229,851 B2 | 1/2016 | Sukegawa et al. | |
| 9,240,245 B1* | 1/2016 | Bellorado | G11C 16/3422 |
| 9,244,858 B1 | 1/2016 | Hu | |
| 9,250,991 B2 | 2/2016 | Frost et al. | |
| 9,552,171 B2* | 1/2017 | Huang | G06F 3/0647 |
| 9,570,198 B2* | 2/2017 | Bellorado | G11C 11/5642 |
| 9,653,176 B2* | 5/2017 | Cai | G11C 16/3431 |
| 9,711,234 B1* | 7/2017 | Van Gaasbeck | G11C 16/3431 |
| 2011/0233648 A1 | 9/2011 | Seol et al. | |
| 2013/0304982 A1* | 11/2013 | Jung, II | G11C 11/40622 |
| | | | 711/106 |
| 2014/0146609 A1* | 5/2014 | Avila | G06F 11/106 |
| | | | 365/185.17 |
| 2014/0173239 A1 | 6/2014 | Schushan | |
| 2014/0229656 A1 | 8/2014 | Goss et al. | |
| 2015/0268871 A1 | 9/2015 | Shu et al. | |
| 2015/0310938 A1* | 10/2015 | Kim | G11C 29/50004 |
| | | | 714/721 |
| 2015/0339188 A1* | 11/2015 | Hu | G06F 11/1072 |
| | | | 714/704 |
| 2016/0034194 A1 | 2/2016 | Brokhman et al. | |
| 2016/0118132 A1* | 4/2016 | Prins | G11C 16/26 |
| | | | 714/704 |

* cited by examiner

FIG. 5

| | |
|---|---|
| WLG4<br>(WL7, WL8) | W_4 |
| WLG3<br>(WL5, WL6) | W_3 |
| WLG2<br>(WL3, WL4) | W_2 |
| WLG1<br>(WL1, WL2) | W_1 |

FIG. 7

|  | B1 | B2 | B3 |
|---|---|---|---|
| WLG4<br>(WL7, WL8) | W_7 | W_6 | W_7 |
| WLG3<br>(WL5, WL6) | W_6 | W_4 | W_6 |
| WLG2<br>(WL3, WL4) | W_5 | W_2 | W_5 |
| WLG1<br>(WL1, WL2) | W_3 | W_1 | W_3 |

FIG. 8

| | SSL1 | | | SSL2 | | | SSL3 | | | SSL4 | | |
|---|---|---|---|---|---|---|---|---|---|---|---|---|
| | B1 | B2 | B3 | B1 | B2 | B3 | B1 | B2 | B3 | B1 | B2 | B3 |
| WLG4 (WL7, WL8) | W_7 | W_6 | W_7 | W_9 | W_8 | W_9 | W_9 | W_8 | W_9 | W_9 | W_8 | W_9 |
| WLG3 (WL5, WL6) | W_6 | W_4 | W_6 | W_6 | W_4 | W_6 | W_7 | W_6 | W_7 | W_7 | W_6 | W_7 |
| WLG2 (WL3, WL4) | W_5 | W_2 | W_5 | W_5 | W_2 | W_5 | W_5 | W_2 | W_5 | W_5 | W_2 | W_5 |
| WLG1 (WL1, WL2) | W_3 | W_1 | W_3 | W_3 | W_1 | W_3 | W_3 | W_1 | W_3 | W_3 | W_1 | W_3 |

STORAGE DEVICE INCLUDING NONVOLATILE MEMORY DEVICE AND CONTROLLER WITH VARIED READ WEIGHTS

CROSS-REFERENCE TO RELATED APPLICATIONS

This U.S. non-provisional patent application claims priority under 35 U.S.C. § 119 to Korean Patent Application No. 10-2016-0082774, filed on Jun. 30, 2016 in the Korean Intellectual Property Office, the entire contents of which are hereby incorporated by reference.

BACKGROUND

1. Technical Field

The present disclosure relates to a semiconductor memory. More particularly, the present disclosure relates to a storage device including a nonvolatile memory device and a controller.

2. Background Information

A storage device refers to a device which stores data under control of a host device such as a computer, a smartphone, and a smart pad. The storage device includes a device which stores data on a magnetic disk, such as a hard disk drive (HDD), or a device which stores data on a semiconductor memory (in particular, a nonvolatile memory), such as a solid state drive (SSD) or a memory card.

The nonvolatile memory includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), etc.

The volume of storage devices has increased as semiconductor manufacturing technologies develop. Additionally, the degree of integration of storage devices continues to increase as semiconductor manufacturing technologies develop. The high degree of integration of the storage devices makes it possible to reduce costs needed to manufacture the storage device. However, the high degree of integration of the storage devices causes scale-down and structure change of the storage devices. Thus, various new problems occur with the high degree of integration.

SUMMARY

Embodiments of the present disclosure provide a storage device with improved speed and reliability.

According to an aspect of an embodiment, a storage device includes a nonvolatile memory device and a controller. The nonvolatile memory device includes multiple memory blocks, each of which includes string selection transistors connected to multiple string selection lines, ground selection transistors connected to multiple ground selection lines, and memory cells connected to multiple word lines. The controller reads data from selected memory cells of a memory block selected from the memory blocks during a read operation. The selected memory cells correspond to both a word line and a string selection line selected as a read target. The controller increases a read count by a read weight corresponding to the selected word line and string selection line of the selected memory block, and performs a refresh operation on the selected memory block if the read count reaches a threshold value. In the selected memory block, two or more read weights are assigned according to locations of the string selection lines and the word lines.

According to another aspect of an embodiment, a storage device includes a nonvolatile memory device and a controller. The nonvolatile memory device includes multiple memory blocks. Each memory block includes multiple memory cells stacked in a direction perpendicular to a substrate and connected with multiple word lines. The controller reads page data selected from multiple page data written in selected memory cells corresponding to a selected word line of a selected memory block of a read target during a read operation. The controller increases a read count by a read weight corresponding to the selected word line and the selected page data of the selected memory block, and performs a refresh operation on the selected memory block if the read count reaches a threshold value. In the selected memory block, two or more read weights are assigned according to locations of the multiple page data and the word lines.

According to another aspect of an embodiment, a storage device includes a nonvolatile memory device and a controller. The nonvolatile memory device includes multiple memory blocks. Each memory block includes multiple memory cells stacked in a direction perpendicular to a substrate and connected with multiple word lines. The controller reads data from selected memory cells of a memory block selected from the memory blocks during a read operation. The memory cells correspond to a word line selected as a read target. The controller increases a read count by a read weight corresponding to the selected word line of the selected memory block, and performs a refresh operation on the selected memory block if the read count reaches a threshold value. In the selected memory block, the controller decreases the read weight as a distance between the selected memory cells and the substrate increases.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 5 illustrates an example in which read weights are set, according to an embodiment of the present disclosure;

FIG. 7 illustrates an example in which read weights are assigned according to distances between the substrate SUB and selected memory cells and a location of target data of pieces of data written in the selected memory cells;

FIG. 8 illustrates an example of read weights assigned in consideration of string selection lines of a memory block;

DETAILED DESCRIPTION

Below, embodiments of the present disclosure will be described more fully with reference to accompanying drawings such that an ordinary one in the art may implement embodiments described herein.

Figure 1:
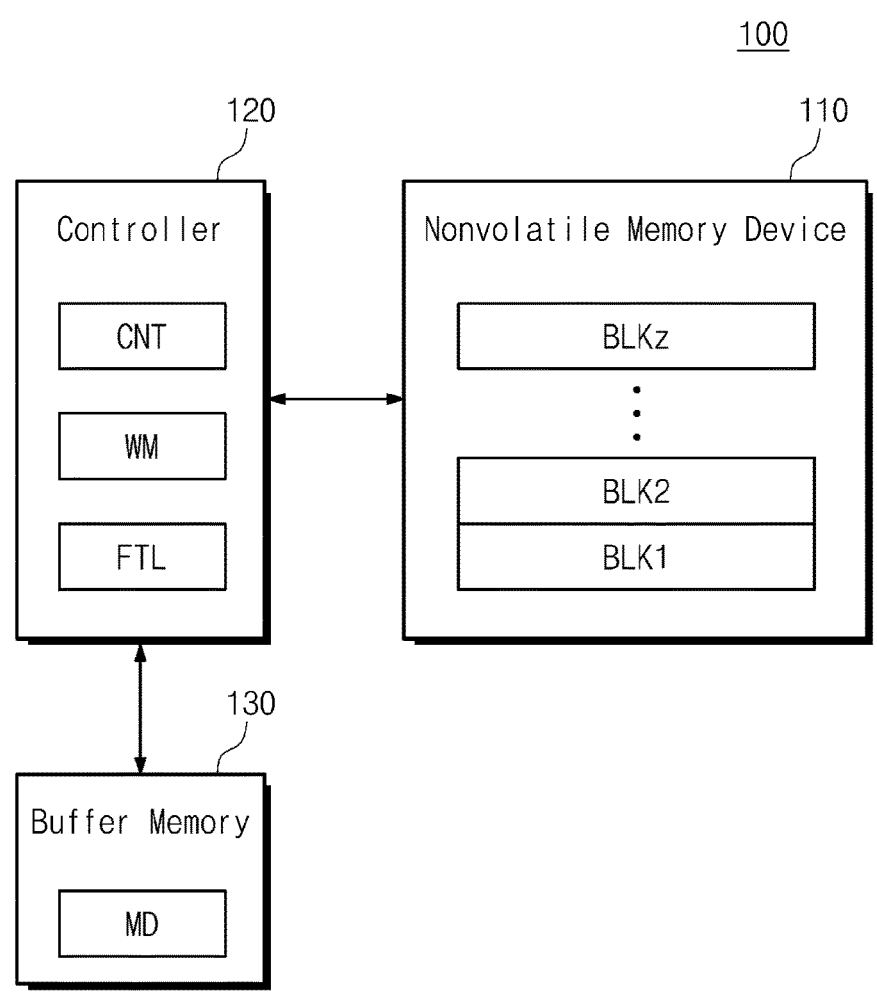
FIG. 1 is a block diagram illustrating a storage device according to an embodiment of the present disclosure.

FIG. 1 is a block diagram illustrating a storage device 100 according to an embodiment of the present disclosure. Referring to FIG. 1, the storage device 100 includes a nonvolatile memory device 110, a controller 120, and a buffer memory 130.

The nonvolatile memory device 110 may perform a write operation, a read operation, and an erase operation under control of the controller 120. The nonvolatile memory device 110 may receive a write command, an address, and data from the controller 120, and may write the data in a location of a storage space specified by or otherwise determinable from the address. The nonvolatile memory device 110 may receive a read command and an address from the controller 120, may read data from a location of a storage space specified by or otherwise determinable from the address, and may output the read data to the controller 120. The nonvolatile memory device 110 may receive an erase command and an address from the controller 120 and may erase data of at a location of a storage space specified by or otherwise determinable from the address.

The nonvolatile memory device 110 may include multiple memory blocks BLK1 to BLKz. Each of the memory blocks BLK1 to BLKz may include multiple memory cells. The memory cells may form a storage space of the nonvolatile memory device 110. Each of the memory blocks BLK1 to BLKz may further include selection transistors that make it possible to select memory cells independently of each other. The memory blocks BLK1 to BLKz may be distinguished according to an operational characteristic or a structural characteristic of the nonvolatile memory device 110. An example in which the memory blocks BLK1 to BLKz are distinguished from each other will be described with reference to FIG. 3.

The nonvolatile memory device 110 may include a flash memory, a phase change random access memory (PRAM), a ferroelectric RAM (FeRAM), a magnetic RAM (MRAM), a resistive RAM (RRAM), etc.

The controller 120 may access the nonvolatile memory device 110 and the buffer memory 130. The controller 120 may perform a write operation, a read operation, and an erase operation in response to a request of an external host device (not illustrated). The controller 120 may write write-requested data in the nonvolatile memory device 110, and may read and output read-requested data from the nonvolatile memory device 110.

The controller 120 may manage the storage device 100 by using the buffer memory 130. For example, the controller 120 may temporarily store data to be written in the nonvolatile memory device 110 or data read from the nonvolatile memory device 110 in the buffer memory 130. The controller 120 may load metadata, which is needed to manage the nonvolatile memory device 110, on the buffer memory 130.

The controller 120 may receive a request which is based on logical addresses, from the external host device. A flash translation layer FTL that is driven by the controller 120 may translate a logical address to a physical address of the nonvolatile memory device 110. The controller 120 may provide the physical address to the nonvolatile memory device 110. Mapping data MD that is needed for translation between a logical address and a physical address may be stored in the nonvolatile memory device 110 and may be loaded and used on the buffer memory 130. The flash translation layer FTL may perform translation between a logical address and a physical address based on the mapping data MD loaded on the buffer memory 130.

The controller 120 may count read operations performed in the nonvolatile memory device 110. For example, the controller 120 may manage a read count with regard to each memory block or each erase unit of the nonvolatile memory device 110. The erase unit may be a part of each memory block or a combination of two or more memory blocks and may indicate a set of memory cells that are simultaneously erased in an erase operation. Below, for descriptive convenience, a description associated with each memory block may be regarded as being associated with each memory block or each erase unit.

With regard to a read count, the controller 120 may include a weight module WM and a counter CNT. The weight module WM may detect or calculate a read weight based on a read target of the nonvolatile memory device 110 identified by or otherwise corresponding to a physical address or a location of the read target. When a read operation is performed on each memory block and a read weight is detected or calculated, the counter CNT may increase the read count by the read weight. For example, the counter CNT may add the read weight to the read count when data is written in each memory block. The read weight may be selected from two or more values based on a read target selected in each memory block or a location of the read target. The controller 120 may determine whether to perform a refresh operation of each memory block, based on the read count.

In an embodiment, each of the flash translation layer FTL, the weight module WM, and the counter CNT of the controller 120 may be implemented with a circuit, a state machine, software, firmware, or a combination of two or more thereof.

Figure 2:
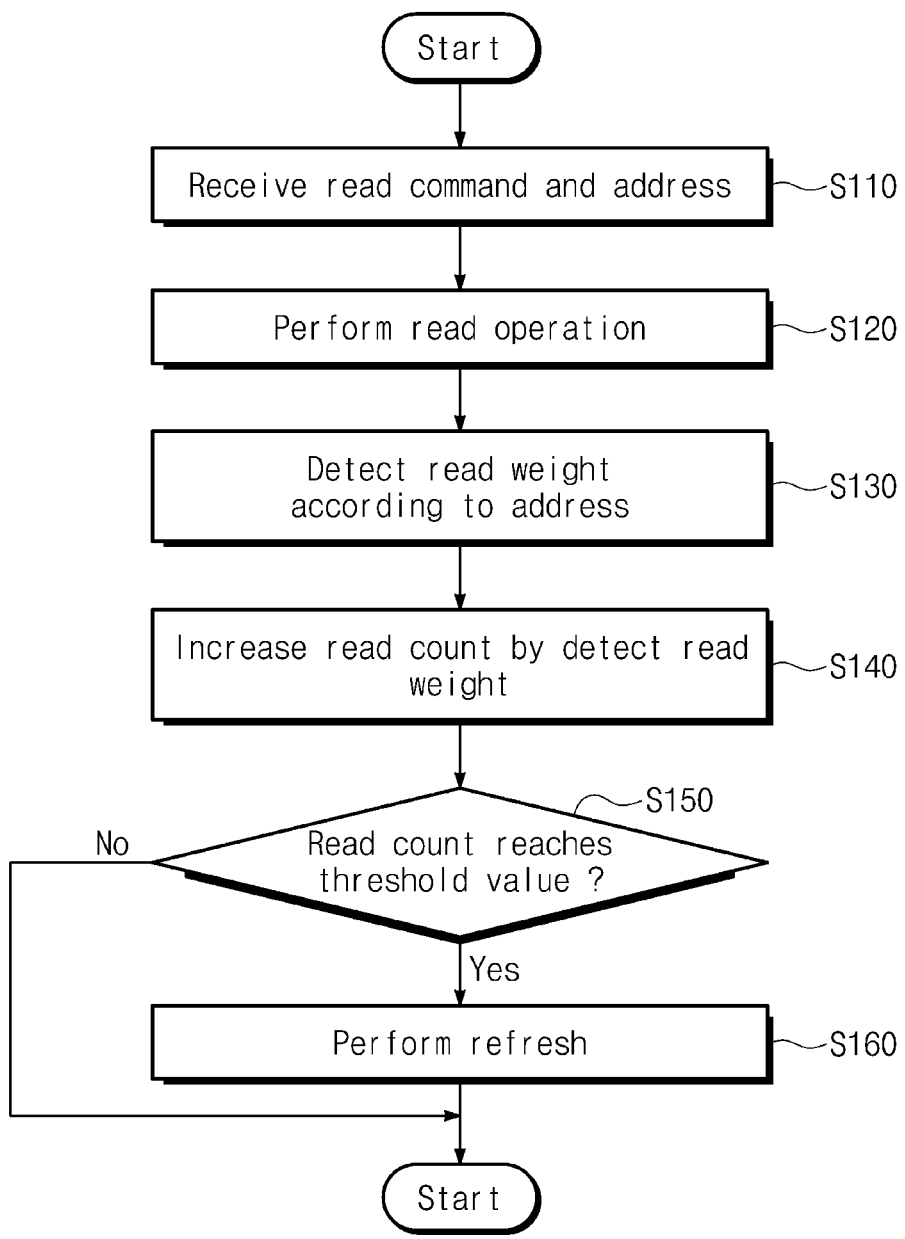
FIG. 2 is a flowchart illustrating an operating method of a storage device according to an embodiment of the present disclosure.

FIG. 2 is a flowchart illustrating an operating method of the storage device 100 according to an embodiment of the present disclosure. Referring to FIGS. 1 and 2, in operation S110, the controller 120 may receive a read command and an address from an external host device. The controller 120 may receive, for example, a read request including a logical address from the external host device.

In operation S120, the controller 120 may select a read operation. For example, the flash translation layer FTL may translate a logical address to a physical address of the nonvolatile memory device 110 based on the mapping data MD. The controller 120 may provide a read command and the physical address to the nonvolatile memory device 110. In response to the read command, the nonvolatile memory device 110 may read data from memory cells corresponding to the physical address, and may output the read data to the controller 120. The controller 120 may output the data received from the nonvolatile memory device 110 to the external host device. The data read from the nonvolatile memory device 110 may be buffered by the buffer memory 130 before output to the external host device.

In operation S130, the controller 130 may detect a read weight based on the physical address. For example, memory cells that are selected according to the physical address as a target of the read operation may be identified, and the weight module WM may detect a read weight corresponding to a location (e.g., a physical address) of the selected memory cells. For example, read weights corresponding to locations (e.g., addresses) of memory cells may be previously stored as nonvolatile information in the controller 120. Also, like the mapping data MD, the read weights may be previously stored in the nonvolatile memory device 110 and may be loaded and used on the buffer memory 130.

In operation S140, the controller 120 may increase the read count by the detected read weight. For example, the counter CNT may add the read weight detected by the weight module WM to a previous read count.

Operation S130 and operation S140 may be carried out in parallel with a read operation that is performed in operation S120.

In operation S150, the controller 120 may determine whether the read count reaches a threshold value. If the read count does not reach the threshold value (S150=No), the process ends. If the read count reaches the threshold value (S150=Yes), operation S160 is performed. In operation S160, the controller 120 may perform a refresh operation. For example, the controller 120 may schedule the refresh operation of a memory block identified by or otherwise corresponding to the physical address.

A read disturbance may occur whenever a read operation is performed on each memory block. The read disturbance may stress memory cells that are not selected as a read target. For example, the read disturbance may cause a change in threshold voltages of unselected memory cells. Data stored in unselected memory cells may vary according to accumulation of the read disturbance.

The refresh operation includes reading valid data from memory cells of a memory block and writing the read data in memory cells of another memory block. If the refresh operation is performed, data that is written in a memory block and experiences the read disturbances may be newly written in another memory block. The influence of the read disturbance disappears when data is newly written in another memory block. Accordingly, if the refresh operation is performed, the influence of the read disturbance disappears, and thus the reliability of data may be recovered.

The storage device 100 according to an embodiment of the present disclosure may recover the reliability of data through the refresh operation before data stored in each memory block is damaged due to accumulation of the read disturbance to such an extent that the damaged data is not recovered.

The weight module WM according to an embodiment of the present disclosure detects a read weight based on a physical address of memory cells of each memory block on which a read operation is performed, that is, a physical location thereof. The read weight may be appreciated as a value that is obtained by quantifying the read disturbance occurring when the read operation is performed on each memory block.

The counter CNT according to an embodiment of the present disclosure may accumulate read weights detected for each memory block as a read count. The read count may be appreciated as a value that is obtained by quantifying the accumulated read disturbance(s) of each memory block.

The storage device 100 according to an embodiment of the present disclosure, as described with reference to FIG. 2, may perform the refresh operation based on a read count that is managed by the weight module WM and the counter CNT. That is, the influence of the read disturbance that varies according to a location of memory cells of each memory block selected as a read target may be used to determine whether to perform the refresh operation. As the refresh operation is performed, the reliability of data written in the nonvolatile memory device 110 may be corrected. Also, the number of times that the refresh operation is performed in the storage device 100 may decrease, and the speed of the storage device 100 may be improved.

Figure 3:
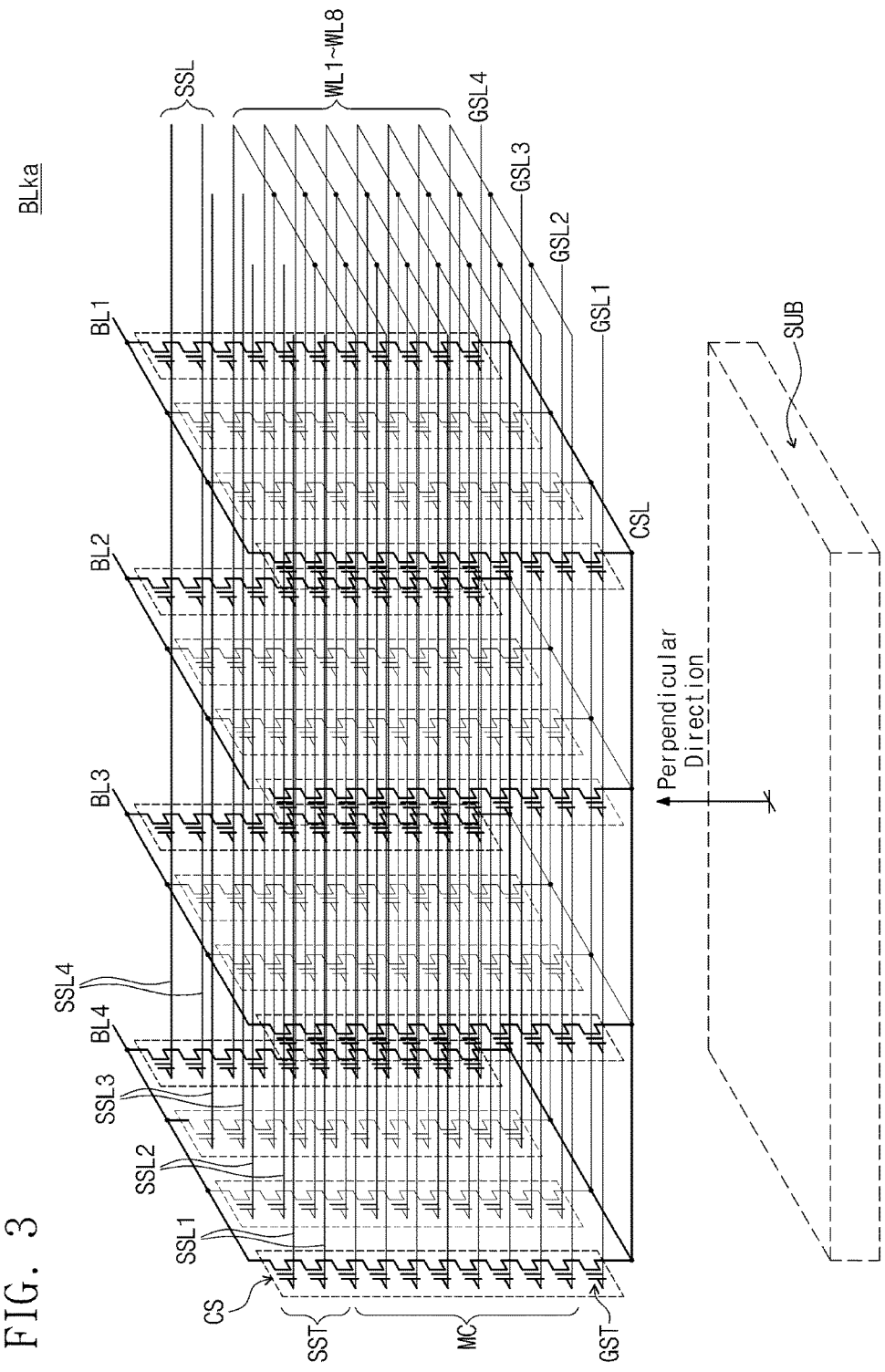
FIG. 3 illustrates an example of a memory block according to an embodiment of the present disclosure.

FIG. 3 illustrates an example of a memory block BLKa according to an embodiment of the present disclosure. Referring to FIG. 3, multiple cell strings CS may be arranged on a substrate SUB in rows and columns. The cell strings CS may be connected in common to a common source line CSL that is formed on (or in) the substrate SUB. In FIG. 3, a location of the substrate SUB is exemplified to help understand a structure of the memory block BLKa. An embodiment is exemplified in FIG. 3 as the common source line CSL is connected to lower ends of the cell strings CS. However, it is enough to electrically connect the common source line CSL to the lower ends of the cell strings CS. However, embodiments of the present disclosure may not be limited to the case that the common source line CSL is physically located at the lower ends of the cell strings CS. In an embodiment, the cell strings CS are shown in FIG. 3 as being arranged 4 by 4. However, embodiments of the present disclosure are not limited to a 4 by 4 arrangement of cell strings CS.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be blurry.

Each cell string may include at least one ground selection transistor GST connected to a corresponding ground selection line, multiple memory cells MC respectively connected to multiple word lines WL1 to WL8, and at least one (or two) string selection transistors SST connected to a corresponding string selection line. In each cell string CS, the ground selection transistor GST, the memory cells MC, and the string selection transistor SST may be serially connected to each other along a direction perpendicular to the substrate SUB and may be sequentially stacked along a direction perpendicular to the substrate SUB.

Memory cells of the cell strings CS that are arranged at the same height (or order) from the substrate SUB or the ground selection transistor GST may be connected to the same word line. Memory cells of the cell strings CS that are arranged at different heights (or orders) from the substrate SUB or the ground selection transistor GST may be connected to different word lines.

The memory block BLKa may be provided at a three-dimensional (3D) memory array. The 3D memory array is monolithically formed in one or more physical levels of arrays of memory cells MC having an active area disposed above a silicon substrate and circuitry associated with the operation of the memory cells MC. The circuit associated with an operation of memory cells MC may be located above or within such substrate. The term "monolithic" means that layers of each level of the array are directly deposited on the layers of each underlying level of the 3D memory array.

In an embodiment of the present disclosure, the 3D memory array includes vertical cell strings CS (or NAND strings) that are vertically oriented such that at least one memory cell is located over another memory cell. Each memory cell may comprise a charge trap layer. Each cell string may further include at least one selection transistor SST placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as multiple levels, with word lines and/or bit lines shared between levels: U.S. Pat. Nos. 7,679,133; 8,553,466; 8,654,587; 8,559,235; and US Pat. Pub. No. 2011/0233648.

Figure 4:
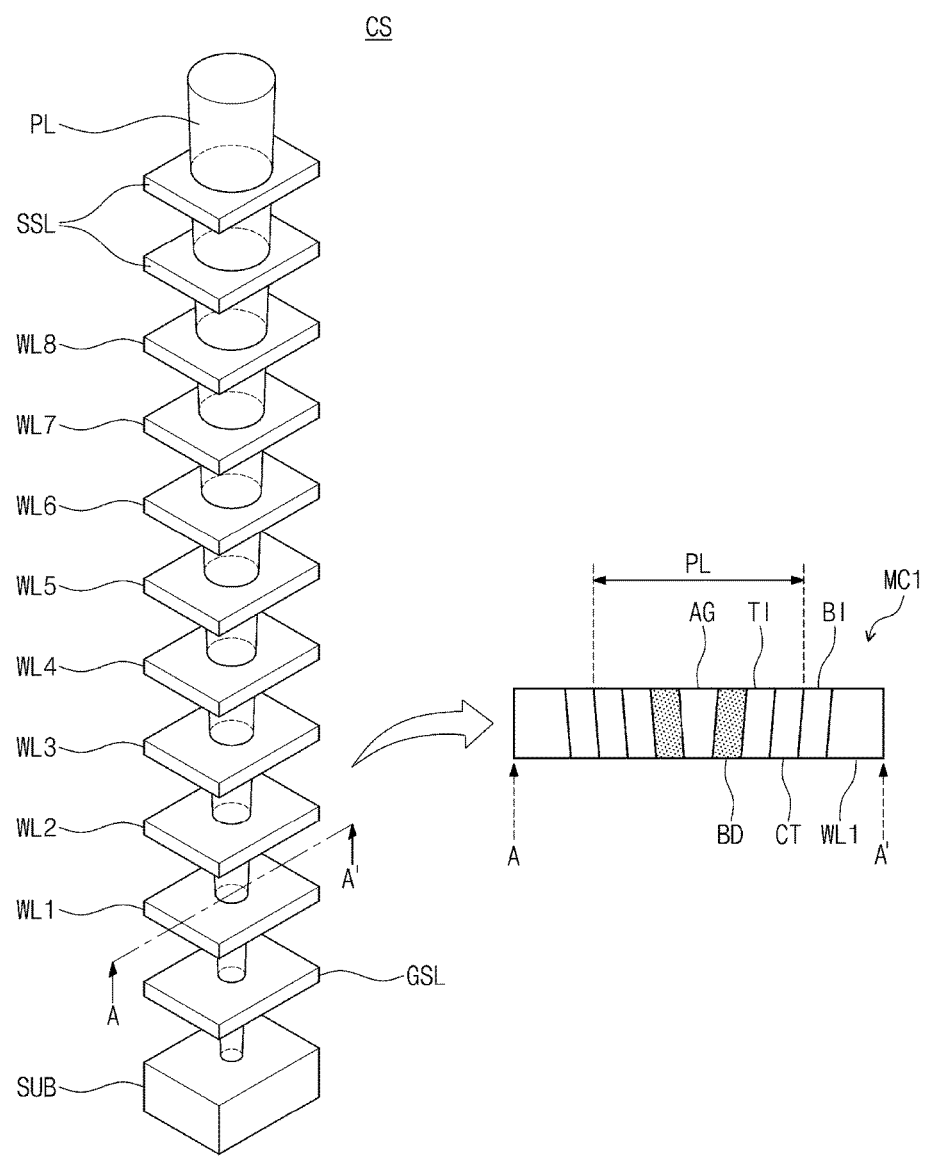
FIG. 4 illustrates an example of a structure of a cell string in a memory block of FIG. 3.

FIG. 4 is a view illustrating an example of a structure of a cell string in the memory block BLKa of FIG. 3. Referring to FIGS. 3 and 4, a pillar PL is provided on the substrate SUB such that the pillar PL extends in a direction perpendicular to the substrate SUB to make contact with the substrate SUB. Each of the ground selection line GSL, the word lines WL1 to WL8, and the string selection lines SSL illustrated in FIG. 4 may be formed of a conductive material parallel with the substrate SUB, for example, a metallic material. The pillar PL may be in contact with the substrate SUB through the conductive materials forming the string selection lines SSL, the word lines WL1 to WL8, and the ground selection line GSL.

A sectional view taken along a line A-A' is also illustrated in FIG. 4. In an embodiment, a sectional view of a first memory cell MC1 corresponding to a first word line WL1 is illustrated. The pillar PL may include a cylindrical body BD. An air gap AG may be defined in the interior of the body BD. The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

In the process of manufacturing the cell string CS, a width of the pillar PL or a cross-sectional area of the pillar PL which is parallel to the upper surface of the substrate SUB may become smaller as a distance from the substrate SUB decreases. Accordingly, when the same voltage is applied to bodies of the ground selection transistor GST, the memory cells MC, and the string selection transistors SST, an electric field formed at a memory cell adjacent to the substrate SUB or at the ground selection transistor GST may be greater than an electric field formed at a memory cell distant from the substrate SUB or at the string selection transistor SST. Similarly, when the same voltage is applied to the ground selection line GSL, the word lines WL1 to WL8, and the string selection lines SSL, the electric field formed at a memory cell adjacent to the substrate SUB or at the ground selection transistor GST may be greater than an electric field formed at a memory cell distant from the substrate SUB or at the string selection transistor SST. The above-described characteristic may have an influence on the read disturbance that is generated while a read operation is performed.

In an embodiment, during a read operation, a selection read voltage is applied to a word line that is connected to memory cells selected as a read target. The selection read voltage has a level within a threshold voltage range of memory cells. Since the strength of an electric field at the selected memory cells is relatively small, the read disturbance may not occur at the selected memory cells or may occur very little. During the read operation, a non-selection read voltage is applied to each word line connected to memory cells that are not selected as the read target. The non-selection read voltage has a level exceeding the threshold voltage range of the memory cells. Since the strength of an electric field at unselected memory cells is relatively great, the read disturbance may occur at the unselected memory cells.

In particular, a level of the non-selection read voltage applied to unselected word lines immediately adjacent to the selected word line is higher than a level of the non-selection read voltage applied to other unselected word lines. Accordingly, the read disturbance that occurs at memory cells connected to unselected word lines adjacent to other unselected word lines may be greater than the read disturbance that occurs at memory cells connected to unselected word lines adjacent to the selected word lines. The read disturbance that occurs at memory cells connected to unselected word lines adjacent to each other may be referred to as "first read disturbance".

Also, as described with reference to FIG. 4, the strength of an electric field at a memory cell becomes greater as a distance between the memory cell and the substrate SUB or the ground selection transistor GST decreases. Accordingly, the read disturbance occurring at a memory cell becomes greater as a distance between the memory cell and the substrate SUB or the ground selection transistor GST decreases. The read disturbance that occurs at memory cells connected to lower word lines close to the substrate SUB, for example, first to fourth word lines WL1 to WL4 may be referred to as "second read disturbance".

When a read operation is performed on lower word lines (or word lines adjacent to or close to the substrate SUB, some (but not all) memory cells connected to the lower word lines may experience both the first read disturbance and the second read disturbance. A third read disturbance may occur due to the overlap between the first read disturbance and the second read disturbance. The third read disturbance may be the strongest read disturbance that occurs when a read operation is performed on the memory block BLKa.

As described with reference to FIGS. 1 and 2, refresh may be used to solve the read disturbance accumulated at memory cells. For example, in the memory block BLKa, the quantity of read disturbance that the memory cells may tolerate may be calculated, measured, or predicted. Also, the quantity of read disturbance occurring when each read operation is performed on a memory block may be calculated, measured, or predicted. The number of read operations that the memory block BLKa can tolerate, that is, a threshold value may be calculated based on the tolerable quantity of read disturbance and the quantity of read disturbance of each read operation.

If the quantity of read disturbance occurring when a read operation is performed once is set to be equal to or more than a value of the third read disturbance, the refresh operation may be performed before data written in the memory block BLKa is damaged. Accordingly, the reliability of data written in the memory block BLKa may be maintained. However, the number of read operations of the memory block BLKa that cause the refresh operation is inversely proportional to the number of times that the refresh operation is performed. An increase in the number of refresh operations causes a decrease in an operating speed of the storage device 100.

In contrast, if the quantity of read disturbance occurring when a read operation is performed once is set to be lower than a value of the third read disturbance, the number of times that the refresh operation is performed on the memory block BLKa may decrease. However, if the read operation of the memory block BLKa causing the read disturbance is iteratively performed (i.e., multiple times), data written in the memory block BLKa may be lost due to a high read disturbance (e.g., the third read disturbance level) before the refresh operation is performed.

The storage device 100 according to an embodiment of the present disclosure may detect a read weight based on an address indicating a location of memory cells or word lines selected as a target of a read operation, and may increase a read count based on the detected read weight. The read weight may be set in consideration of the quantity of practical read disturbance occurring during a read operation performed on each word line. Accordingly, it may be possible to prevent data written in the memory block BLKa from being lost due to the read disturbance and to reduce the number of times that a refresh operation is performed. That is, a storage device with improved speed and reliability is provided. Below, adjacent to the substrate SUB or a distance from the substrate SUB may be interpreted as meaning adjacent to the substrate SUB or the ground selection transistor GST or a distance from the substrate SUB or the ground selection transistor GST. Distance as the word is used herein, however, can be measured by the number (if any) of intervening transistors, as well as by more traditional measures such as in centimeters or inches even if the traditional measures are imprecise estimates of an actual distance from a substrate.

FIG. 5 illustrates an example in which read weights are set, according to an embodiment of the present disclosure. Referring to FIGS. 3, 4, and 5, the first read disturbance and the second read disturbance may overlap more (i.e., occur more frequently) as memory cells selected as a read target become closer to the substrate SUB. The first read disturbance and the second read disturbance may overlap less (i.e., occur less frequently) as memory cells selected as a read target become more distant from the substrate SUB. As the first read disturbance and the second read disturbance overlap more, the high level of the third read disturbance that actually occurs due to a single read operation performed on the memory block BLKa increases. As the first read disturbance and the second read disturbance overlap less, the high level of the third read disturbance that actually occurs due to a single read operation performed on the memory block BLKa decreases.

The word lines WL1 to WL8 of the memory block BLKa may be classified into first, second, third, and fourth word line groups WLG1, WLG2, WLG3, and WLG4 based on the above-described characteristics. For example, the word lines WL1 to WL8 may be grouped according to distances from the substrate SUB. A first read weight W_1 may be assigned to the first and second word lines WL1 and WL2 of which the distance from the substrate SUB is the shortest. A read count may increase by the first read weight W_1 when a read operation is performed on memory cells connected to one of the first and second word lines WL1 and WL2.

Based on distances from the substrate SUB, a second read weight W_2 may be assigned to the second word line group WLG2 including third and fourth word lines WL3 and WL4. A third read weight W_3 may be assigned to the third word line group WLG3 including fifth and sixth word lines WL5 and WL6. A fourth read weight W_4 may be assigned to the fourth word line group WLG4 including seventh and eighth word lines WL7 and WL8. As a distance from the substrate SUB increases, a read weight of memory cells, in other words, a read weight associated with a word line group (or a word line) corresponding to (or connected to) memory cells may decrease. For example, the second read weight W_2 may be smaller than the first read weight W_1, the third read weight W_3 may be smaller than the second read weight W_2, and the fourth read weight W_4 may be smaller than the third read weight W_3.

As described above, if a read weight is adjusted according to a distance between memory cells selected as a read target and the substrate SUB, the storage device 100 may be provided with improved speed and reliability. In particular, if a read weight decreases as a distance between the substrate SUB and the selected memory cells increases, the storage device 100 with improved speed and reliability is provided.

Figure 6:
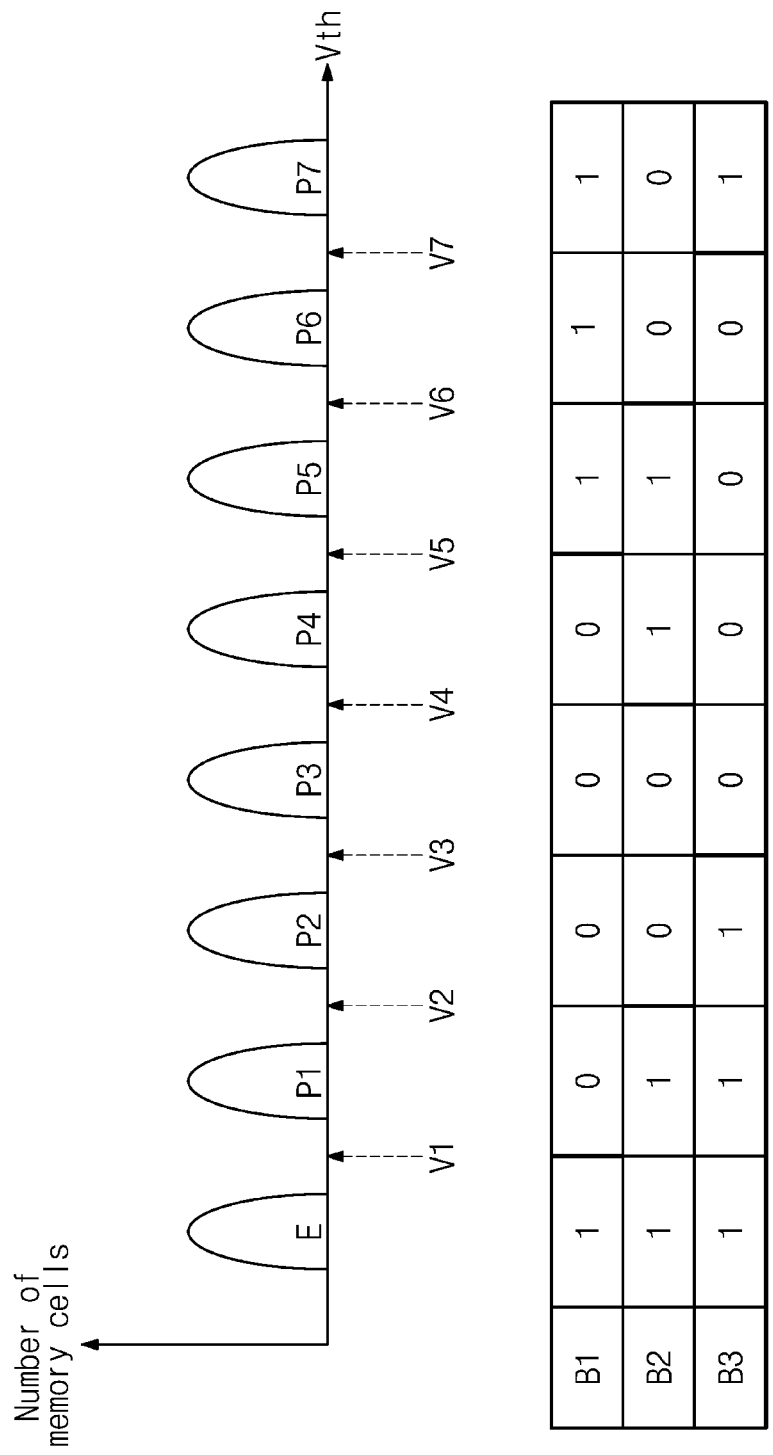
FIG. 6 illustrates an example of threshold voltages of memory cells and data bits corresponding thereto.

FIG. 6 illustrates an example of threshold voltages of memory cells MC and data bits corresponding thereto. In FIG. 6, the abscissa (X-axis value) represents a threshold voltage Vth of a memory cell MC, and the ordinate (Y-axis value) represents the number of memory cells MC. In an embodiment, an example in which three bits are written in each memory cell MC is illustrated in FIG. 6.

Referring to FIGS. 3, 4, and 5, if three bits B1, B2, and B3 are written in each memory cell MC, the memory cells MC may have eight possible logical states, that is, an erase state E and first to seventh program states P1 to P7 based on the three bits B1, B2, and B3. For example, when bits B1, B2, and B3 written in the memory cell MC are "111", the memory cell MC may correspond to the erase state E and may be programmed to have a threshold voltage lower than a first voltage V1. When bits B1, B2, and B3 written in the memory cell MC are "011", the memory cell MC may correspond to the first program state P1 and may be programmed to have a threshold voltage between the first voltage V1 and a second voltage V2. When bits B1, B2, and B3 written in the memory cell MC are "001", the memory cell MC may correspond to the second program state P2 and may be programmed to have a threshold voltage between the second voltage V2 and a third voltage V3. When bits B1, B2, and B3 written in the memory cell MC are "000", the memory cell MC may correspond to the third program state P3 and may be programmed to have a threshold voltage between the third voltage V3 and a fourth voltage V4. When bits B1, B2, and B3 written in the memory cell MC are "010", the memory cell MC may correspond to the fourth program state P4 and may be programmed to have a threshold voltage between the fourth voltage V4 and a fifth voltage V5. When bits B1, B2, and B3 written in the memory cell MC are "110", the memory cell MC may correspond to the fifth program state P5 and may be programmed to have a threshold voltage between the fifth voltage V5 and a sixth voltage V6. When bits B1, B2, and B3 written in the memory cell MC are "100", the memory cell MC may correspond to the sixth program state P6 and may be programmed to have a threshold voltage between the sixth voltage V6 and a seventh voltage V7. When bits B1, B2, and B3 written in the memory cell MC are "101", the memory cell MC may correspond to the seventh program state P7 and may be programmed to have a threshold voltage greater than the seventh voltage V7.

During a read operation, data written in the memory cells MC may be determined by distinguishing threshold voltages of memory cells MC using the first to seventh voltages V1 to V7.

The controller 120 may read bits B1, B2, and B3 written in the memory cell MC independently of each other. For example, during the read operation, the controller 120 may selectively read one of first data including first bits B1, second data including second bits B2, and third data including third bits B3 from memory cells selected as a read target.

As illustrated in FIG. 6, however, read counts corresponding to read operations of the first to third data may be different from each other. For example, upon reading of the first data including the first bits B1, a determination may be made as to whether the first bits B1 written in memory cells selected as a read target are "1" or "0". As depicted in FIG. 6 by a bold line, the nonvolatile memory device 110 may read the first data through read operations using the first voltage V1 and the fifth voltage V5, that is, by performing the read operation twice. When reading the second data including the second bits B2, the nonvolatile memory device 110 may read the second data through read operations using the second voltage V2, the fourth voltage V4, and the sixth voltage V6, that is, by performing the read operation three times. When reading the third data including the third bits B3, the nonvolatile memory device 110 may read the third data through read operations using the third voltage V3 and the seventh voltage V7, that is, by performing the read operation twice.

As the number of times that a read operation is performed to read the first, second, or third data (or a total of time during which a non-selection read voltage is applied) increases, the quantity of read disturbance occurring during the read operation increases. Accordingly, in the case where read counts associated with read operations of the first to third data written in selected memory cells MC are different from each other, a read weight may be additionally adjusted according to whether any data is a read target.

In FIG. 6, logical states and bit values corresponding thereto are exemplary, and embodiments of the present disclosure may not be limited thereto.

FIG. 7 illustrates an example in which read weights are assigned according to distances between the substrate SUB and selected memory cells and a location of target data of pieces of data written in the selected memory cells. Referring to FIGS. 3, 4, and 7, first to seventh read weights W_1 to W_7 may be assigned to memory cells of the memory block BLKa. The first to seventh read weights W_1 to W_7 may have values that sequentially decrease. A value of the first read weight W_1 may have the greatest value, and the seventh read weight W_7 may have the smallest value.

As described with reference to FIG. 5, a read weight indicating the read disturbance may decrease as a distance between memory cells (selected as a read target) and the substrate SUB increases. For example, with regard to read operations of the first data including the first bits B1, a read weight may decrease in the order of the third, fifth, sixth, and seventh weights W_3, W_5, W_6, and W_7 as a distance between the selected memory cells and the substrate SUB increases. With regard to read operations of the second data including the second bits B2, a read weight may decrease in the order of the first, second, fourth, and sixth weights W_1, W_2, W_4, and W_6 as a distance between the selected memory cells and the substrate SUB increases. With regard to read operations of the third data including the third bits B3, a read weight may decrease in the order of the third, fifth, sixth, and seventh weights W_3, W_5, W_6, and W_7 as a distance between the selected memory cells and the substrate SUB increases.

As described with reference to FIG. 6, a read weight may increase as the number of times that a read operation is performed (i.e., to read the first, second, or third data) increases. For example, in memory cells belonging to the first word line group WLG1, the third read weight W_3 may be added to a read count upon reading of the first or third data accompanying two read operations, and the first read weight W_1 may be added to a read count upon reading of the second data accompanying three read operations. In memory cells belonging to the second word line group WLG2, the fifth read weight W_5 may be added to a read count upon reading of the first or third data accompanying two read operations, and the second read weight W_2 may be added to a read count upon reading of the second data accompanying three read operations. In memory cells belonging to the third word line group WLG3, the sixth read weight W_6 may be added to a read count upon reading of the first or third data accompanying two read operations, and the fourth read weight W_4 may be added to a read count upon reading of the second data accompanying three read operations. In memory cells belonging to the fourth word line group WLG4, the seventh read weight W_7 may be added to a read count upon reading of the first or third data accompanying two read operations, and the sixth read weight W_6 may be added to a read count upon reading of the second data accompanying three read operations.

As described above, the reliability and speed of the storage device 100 may be further improved by calculating a read weight in consideration of a location of data selected from pieces of data written in selected memory cells as well as a distance between the selected memory cells and the substrate SUB, that is, a location of the selected memory cells (or selected word lines). Notably, a location of data (e.g., within a memory cell) therefore has a different context and meaning than a location of a memory cell.

The number of read operations performed according to pieces of data (or locations of pieces of data) written in memory cells MC in a read operation is not limited to the exemplary numbers illustrated in FIGS. 6 and 7.

In an embodiment, information (i.e., or e.g., "read count information") about the number of read operations to be performed for pieces of data (or locations of pieces of data) written in memory cells MC in a read operation (or read weights corresponding to the read count information) may be previously stored in the controller 120 as nonvolatile information upon manufacturing of the storage device 100. As another example, parameters for the read count information (or read weights corresponding to read count information) may be previously stored in the nonvolatile memory device 110 as nonvolatile information upon manufacturing of the storage device 100. When electric power is supplied to the storage device 100, the nonvolatile memory device 110 may provide the stored information to the controller 120.

FIG. 8 illustrates an example of read weights assigned additionally considering the string selection lines SSL1 to SSL4 of the memory block BLKa. Referring to FIGS. 3, 4, 7, and 8, first to ninth read weights W_1 to W_9 may be set according to memory cells selected as a read target. The first to ninth read weights W_1 to W_9 may have values that sequentially decrease.

When a read operation is performed on memory cells corresponding to the first string selection line SSL1, read weights may be set the same as that described with reference to FIG. 7.

When a read operation is performed on memory cells belonging to the first to third word line groups WLG1 to WLG3, read weights for memory cells corresponding to the first string selection line SSL1 are the same as read weights for memory cells corresponding to the second string selection line SSL2. However, when a read operation is performed on memory cells belonging to the fourth word line group WLG4, read weights for memory cells corresponding to the second string selection line SSL2 are smaller than read weights for memory cells corresponding to the first string selection line SSL1.

When a read operation is performed on memory cells belonging to the first to third word line groups WLG1 to WLG2, read weights for memory cells corresponding to the first string selection line SSL1 are the same as read weights for memory cells corresponding to the third or fourth string selection line SSL3 or SSL4. However, when a read operation is performed on memory cells belonging to the third and fourth word line groups WLG3 and WLG4, read weights for memory cells corresponding to the third or fourth string selection line SSL3 or SSL4 are smaller than read weights for memory cells corresponding to the first string selection line SSL1.

As described with reference to FIG. 8, if a read weight varies according to a string selection line (or a location of a string selection line) corresponding to selected memory cells, the reliability and speed of the storage device 100 may be further improved.

If the read disturbance occurs, charges may be discharged from charge trap layers of memory cells MC or may be trapped in the charge trap layers thereof. That is, charges move in the charge trap layers of the memory cells MC. If charges move, a stabilization time is needed until charges of the charge trap layers are stabilized. If a read operation is further performed before the stabilization time elapses after the read disturbance occurs at the memory cells MC, the read disturbance may occur additionally. If the read disturbance occurs additionally before charges trapped in the memory cells MC are stabilized, the influence of the read disturbance may increase more and more. Accordingly, an interval at which a read operation is performed (or the read disturbance occurs), in other words, the number of times that a read operation is performed may have an influence on a total of read disturbance, and this may be used to calculate the read weights.

Figure 9:
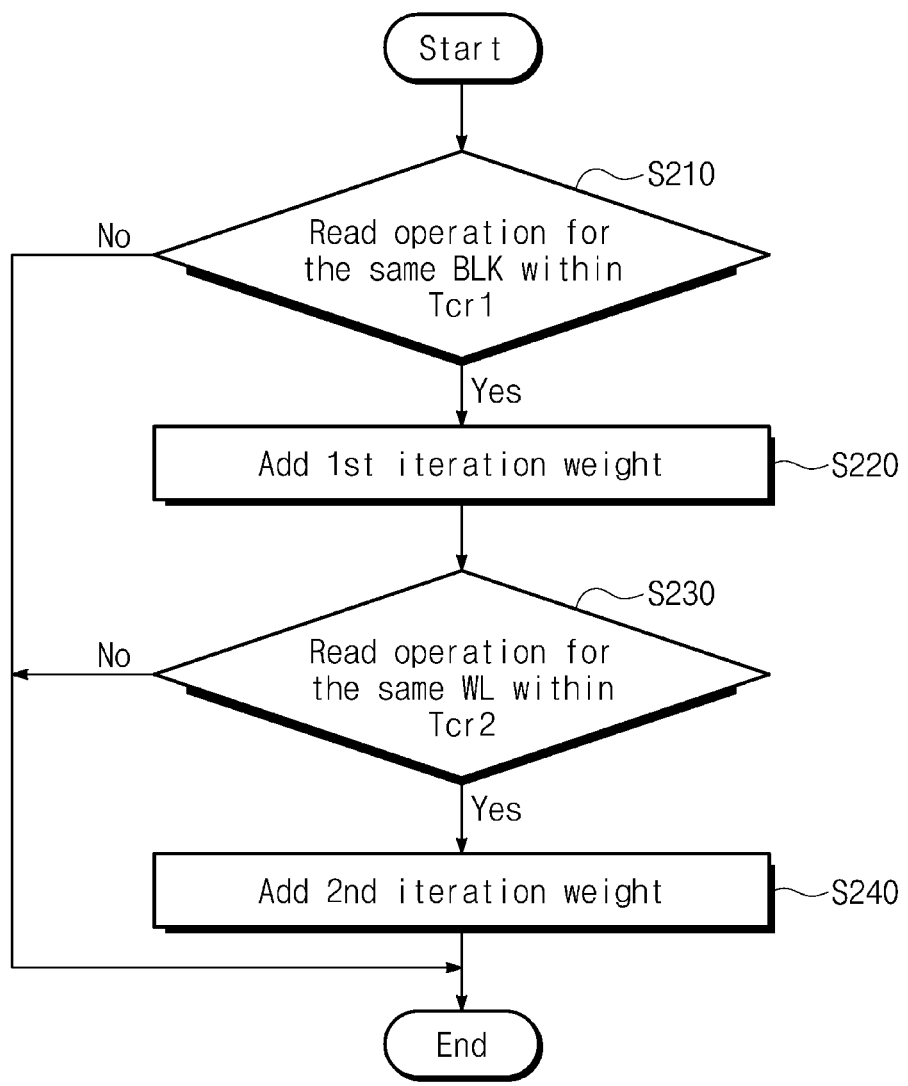
FIG. 9 is a flowchart illustrating an example in which a read weight is adjusted according to the number of times that a read operation is performed.

FIG. 9 is a flowchart illustrating an example in which a read weight is adjusted according to the number of times that a read operation is performed. Referring to FIGS. 1, 3, and 9, in operation S210, the controller 120 determines whether a read operation is performed on the same memory block BLKa within a first predetermined critical time period Tcr1. For example, the controller 120 may determine whether a time interval between a read operation currently performed on the memory block BLKa and a read operation previously performed thereon is within the first predetermined critical time period Tcr1. If the time interval is greater than the first predetermined critical time period Tcr1 (S210=No), the read weight may not be adjusted additionally. If the time interval is within the first predetermined critical time period Tcr1 (S210=Yes), it may be determined that the second read disturbance occurs additionally due to a current read operation before charges of memory cells MC are stabilized after occurrence of the second read disturbance of a previous read operation in the memory block BLKa. Accordingly, in operation S220, a first iteration weight may be added to the read weight, and thus the read weight may increase.

In operation S230, the controller 120 determines whether a read operation is performed on the same word line within a second critical time period Tcr2. For example, the controller 120 may determine whether read operations currently performed and previously performed on the memory block BLKa are associated with the same word line of the memory block BLKa and a time interval between the read operations is within the second critical time period Tcr2. If the time interval is not less than the second critical time period Tcr2 (S230=No), the read weight may not be adjusted additionally. If the time interval is within the second critical time period Tcr2 (S230=Yes), it may be determined that the first read disturbance occurs additionally due to a current read operation before charges of memory cells MC are stabilized after occurrence of the first read disturbance of a previous read operation in the memory block BLKa. Accordingly, in operation S240, a second iteration weight may be added to the read weight, and thus the read weight may increase.

In an embodiment, the iteration weight may be subdivided for each section. For example, the controller 120 may count the number of times that the first iteration weight (or the second iteration weight) is continuously or sequentially added and may increase the first iteration weight (or the second iteration weight) as the count increases. Also, the controller 120 may reset the first iteration weight (or the second iteration weight) if the first iteration weight (or the second iteration weight) is not added during a predetermined time period in each memory block.

In an embodiment, the controller 120 may subdivide the first critical time period (or the second critical time period) into multiple sections. The controller 120 may variably select the first iteration weight (or the second iteration weight), based on whether a time interval between a previous read operation and a current read operation belongs to any section of the first critical time period (or the second critical time period). For example, the first iteration weight (or the second iteration weight) may increase as the time interval decreases.

The read disturbance may become greater as a temperature when a read operation is performed becomes lower, and as a difference between a temperature when a read operation is performed and a temperature when data is written in memory cells selected as a read target becomes greater. Accordingly, a read weight may be further adjusted by applying a temperature associated with a read operation.

Figure 10:
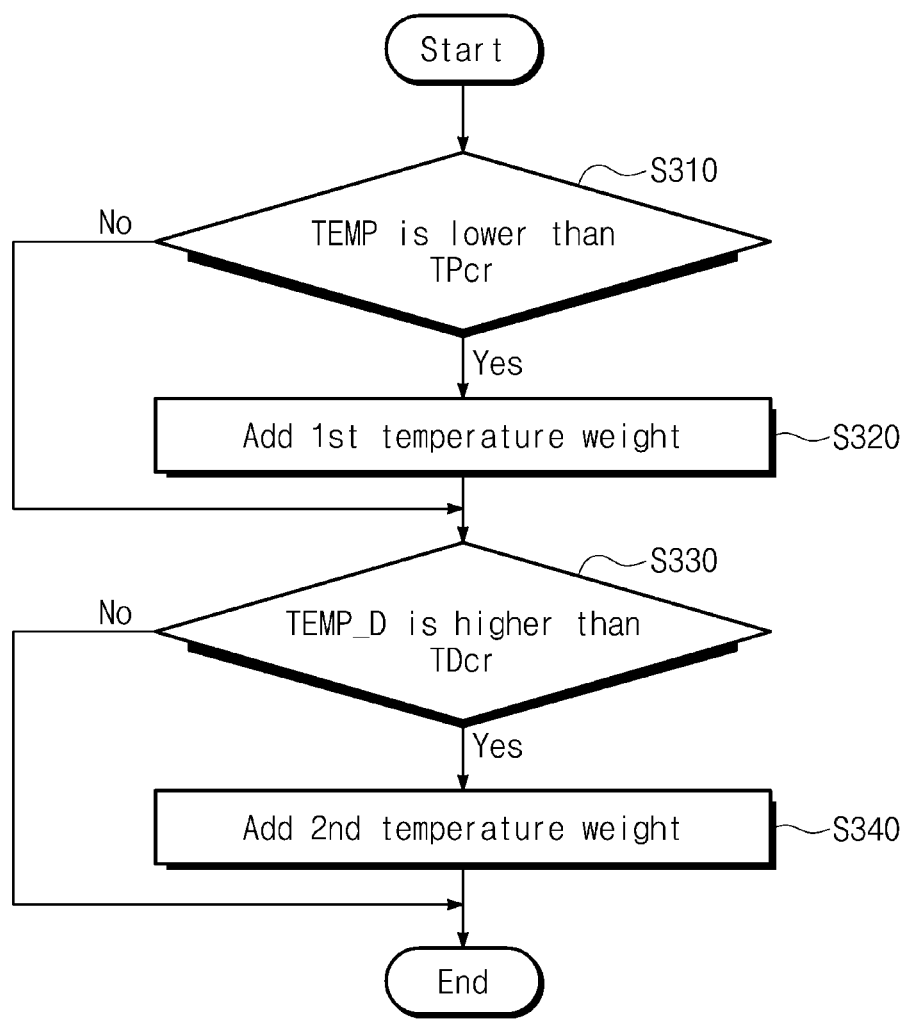
FIG. 10 is a flowchart illustrating an example in which a read weight is adjusted based further on a temperature associated with a read operation.

FIG. 10 is a flowchart illustrating an example in which a read weight is adjusted based further on a temperature associated with a read operation. Referring to FIGS. 1, 3, and 10, in operation S310, the controller 120 determines whether a temperature TEMP when a read operation is performed is lower than a critical temperature TPcr. If the temperature TEMP is lower than the critical temperature TPcr (S310=Yes), in operation S320, the controller 120 may increase a read weight by adding a first temperature weight to the read weight. For example, the critical temperature TPcr may be −10 degrees Celsius.

In operation S330, the controller 120 determines whether a temperature difference TEMP_D between a temperature when a read operation is performed and a temperature when data is written in memory cells selected as a read target is higher than a critical temperature difference TDcr. If the temperature difference TEMP_D is higher than the critical temperature difference TDcr (S330=Yes), in operation S340, the controller 120 may increase the read weight by adding a second temperature weight to the read weight.

In an embodiment, as described with reference to FIG. 9, the first temperature weight or the second temperature weight may be subdivided according to sections of the critical temperature TPcr or the critical temperature difference TDcr.

As described above, the storage device 100 according to an embodiment of the present disclosure may estimate the practical read disturbance occurring in a read operation in consideration of memory cells selected for the read operation, data to be read, the number of times that the read operation is performed, and an environment (e.g., a temperature) parameter associated with the read operation. The storage device 100 may apply the estimation result to the read weight, and may increase a read count based on the read weight. The read count is used as a criterion for determining whether to perform a refresh operation. Accordingly, since the refresh operation is performed based on the practical read disturbance occurring when read operations are performed, the reliability and speed of the storage device 100 may be improved.

Figure 11:
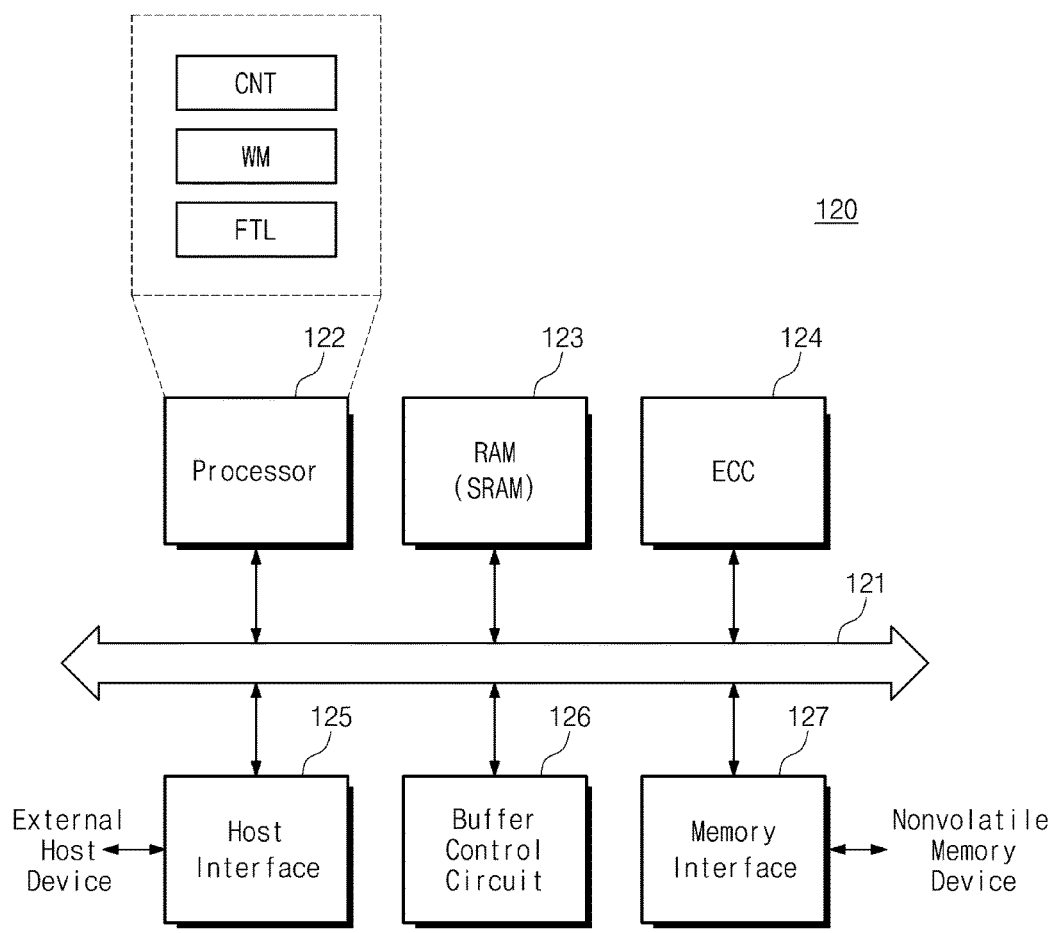
FIG. 11 is a block diagram illustrating a controller according to an embodiment of the present disclosure.

FIG. 11 is a block diagram illustrating the controller 120 according to an embodiment of the present disclosure. Referring to FIGS. 1 and 11, the controller 120 includes a bus 121, a processor 122, a RAM 123, an ECC block 124, a host interface 125, a buffer control circuit 126, and a memory interface 127.

The bus 121 may be configured to provide a channel among components of the controller 120.

The processor 122 may control overall operations of the controller 120 and may execute a logical operation. The processor 122 may communicate with an external host device through the host interface 125, may communicate with the nonvolatile memory device 110 through the memory interface 127, and may communicate with the RAM 130 through the buffer control circuit 126. The processor 122 may control the storage device 100 using the RAM 123 as a working memory, a cache memory, or a buffer memory.

At least one of the flash translation layer FTL, the weight module WM, and the counter CNT may be implemented in the form of software driven by the processor 122, such as firmware, an operating system, and an application. As another example, at least one of the flash translation layer FTL, the weight module WM, and the counter CNT may be implemented with hardware, such as circuitry or an integrated circuit, in the interior of the processor 122. Alternatively, at least one of the flash translation layer FTL, the weight module WM, and the counter CNT may be implemented in the form of a combination of hardware and software in connection with the processor 122. Alternatively, at least one of the flash translation layer FTL, the weight module WM, and the counter CNT may be implemented with a module that is separated from the processor 122.

The RAM 123 may be used as a working memory, a cache memory, or a buffer memory of the processor 122. The RAM 123 may store codes or commands that the processor 122 will execute. The RAM 123 may store data processed by the processor 122. The RAM 123 may include a static RAM (SRAM).

The ECC block 124 may perform an error correction operation. The ECC block 124 may perform error correction encoding based on data to be written in the nonvolatile memory device 110 through the memory interface 127. The error correction encoded data may be provided to the nonvolatile memory device 110 through the memory interface 127. The ECC block 124 may perform error correction decoding on data received through the memory interface 127 from the nonvolatile memory device 110. In an embodiment, the ECC block 124 may be included in the memory interface 127 as a component of the memory interface 127.

The host interface 125 may be configured to communicate with the external host device under control of the processor 122. The host interface 125 may convey communications using at least one of various communication manners, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer control circuit 126 may control the RAM 123 under control of the processor 122.

The memory interface 127 may communicate with the nonvolatile memory device 110 in response to control of the processor 122. As described with reference to FIG. 1, the memory interface 127 may convey a command, an address, and data to the nonvolatile memory package 110 through the input/output channel. The memory interface 127 may convey a control signal to the nonvolatile memory device 110 through the control channel.

In an embodiment, in the case where the storage device 100 does not include the RAM 130, the controller 120 may not include the buffer control circuit 126.

In an embodiment, the processor 122 may control the controller 120 by using codes. The processor 122 may load codes from a nonvolatile memory device (e.g., a read only memory) that is implemented in the interior of the controller 120. Alternatively, the processor 122 may load codes from the nonvolatile memory device 110 through the memory interface 127.

In an embodiment, the bus 121 of the controller 120 may be divided into a control bus and a data bus. In an embodiment, the data bus may transfer data in the controller 120, and the control bus may transfer the following control information in the controller 120: a command and an address. The data bus and the control bus may be independent of each other to prevent mutual interference or influence. The data bus may be connected with the ECC block 124, the host interface 125, the buffer control circuit 126, and the memory interface 127. The control bus may be connected with the processor 122, the RAM 123, the host interface 125, the buffer control circuit 126, and the memory interface 127.

A storage device according to an embodiment of the present disclosure may increase a read count based on a location of memory cells of a read target and may perform a refresh operation based on the read count. The read disturbance due to a read operation may be compensated for through a refresh operation, and the number of times that the refresh operation is performed may decrease by changing a read count based on a location of memory cells. Accordingly, the storage device with improved speed and reliability may be provided.

While the present disclosure describes exemplary embodiments, it will be apparent to those skilled in the art that various changes and modifications may be made without departing from the spirit and scope of the concepts described herein. Therefore, it should be understood that the above embodiments are not limiting, but illustrative.

What is claimed is:

1. A storage device, comprising:
a nonvolatile memory device comprising a plurality of memory blocks, each of which comprises string selection transistors connected to a plurality of string selection lines, ground selection transistors connected to a plurality of ground selection lines, and memory cells connected to a plurality of word lines; and
a controller configured to read data from selected memory cells, which correspond to both a word line and a string selection line selected as a read target, of a memory block, selected as a selected memory block from the memory blocks, during a read operation,
wherein the controller increases a read count for the selected memory block by a read weight corresponding to the selected word line and string selection line of the selected memory block and performs a refresh operation on the selected memory block if the read count reaches a threshold value,
wherein, in the selected memory block, two or more read weights are assigned according to locations of the string selection lines and the word lines,
wherein each of the selected memory cells is configured to store a plurality of page data, and
wherein the controller is configured to further adjust the read weight based on whether any page data among the plurality of page data is a read target.

2. The storage device of claim 1,
wherein the memory cells of each memory block are stacked in a direction perpendicular to a substrate.

3. The storage device of claim 2,
wherein the read weight decreases as a distance between the selected memory cells and the substrate increases.

4. The storage device of claim 2,
wherein, in each memory block, the string selection lines are connected to rows of cell strings, each of which comprises a ground selection transistor, memory cells, and a string selection transistor.

5. The storage device of claim 4,
wherein the string selection lines comprise a first string selection line, a second string selection line, and intermediate string selection lines arranged between the first and second string selection lines, and
wherein the read weight decreases as a distance between the selected string selection line and the first string selection line decreases.

6. The storage device of claim 1,
wherein the controller increases the read weight as a number of reads performed to determine the page data of the read target increases.

7. The storage device of claim 6,
wherein the nonvolatile memory device is configured to send information about the number of reads performed to determine each of the page data, to the controller.

8. The storage device of claim 1,
wherein the controller is configured to adjust the read weight based on a period that the read operation is performed.

9. The storage device of claim 8,
wherein the controller increases the read weight if a previous read operation of the selected memory block was performed within a first time period from a time point when the read operation is performed.

10. The storage device of claim 9,
wherein the controller further increases the read weight if the previous read operation of the selected word line was performed within a second time period from a time point when the read operation is performed.

11. The storage device of claim 1,
wherein the controller is configured to adjust the read weight based on a temperature when the read operation is performed.

12. The storage device of claim 11,
wherein the controller increases the read weight when the read operation is performed when a temperature is lower than a predetermined temperature.

13. The storage device of claim 11,
wherein the controller increases the read weight when a temperature difference between a temperature when the read operation is performed and a temperature when data is written in the selected memory cells is greater than a predetermined temperature difference.

14. The storage device of claim 1,
wherein the refresh operation comprises an operation in which the controller reads valid data among data written in memory cells of the selected memory block and writes the read data in another memory block.

15. The storage device of claim 1,
wherein the controller is configured to receive a read command and a logical address, to convert the logical address into a physical address of the nonvolatile memory device, and to perform the read operation on the selected memory cells corresponding to the selected word line and string selection line as indicated by the physical address, in response to the read command.

16. A storage device, comprising:
a nonvolatile memory device comprising a plurality of memory blocks, each of which comprises string selection transistors connected to a plurality of string selection lines, ground selection transistors connected to a plurality of ground selection lines, and memory cells connected to a plurality of word lines;
a controller configured to read data from selected memory cells, which correspond to both a word line and a string selection line selected as a read target, of a memory block, selected as a selected memory block from the memory blocks, during a read operation,
wherein the controller is configured to increase a read count for the selected memory block by a read weight corresponding to the selected word line and string selection line of the selected memory block and to perform a refresh operation on the selected memory block if the read count reaches a threshold value,
wherein, in the selected memory block, a read weight changes according to which of the plurality of string selection lines is selected with respect to the selected word line,
wherein the controller is configured to read page data selected from a plurality of page data written in the selected memory cells and to select a value corresponding to all of the selected string selection line, the selected word line, and the selected page data as the read weight, and
wherein, in the selected memory block, the controller decreases the read weight as a distance between the selected memory cells and a substrate increases, and as a number of read operations performed to determine the selected page data decreases.

17. A storage device, comprising:
a nonvolatile memory device comprising a plurality of memory blocks each comprising a plurality of memory cells stacked in a direction perpendicular to a substrate and connected with a plurality of word lines; and a controller configured to read data from selected memory cells, which correspond to a word line selected as a read target, of a memory block, selected as a selected memory block from the memory blocks, during a read operation, wherein the controller is configured to increase a read count for the selected memory block by a read weight corresponding to the selected word line of the selected memory block and to perform a refresh operation on the selected memory block if the read count reaches a threshold value, wherein, in the selected memory block, the controller decreases the read weight as a distance between the selected memory cells and the substrate increases, and wherein the controller is configured to adjust the read weight based on a temperature.

18. The storage device of claim 17, wherein the controller is configured to adjust the read weight based on a number of times that the read operation is performed.

\* \* \* \* \*